United States Patent [19]

Matsuo et al.

[11] Patent Number: 4,599,522

[45] Date of Patent: Jul. 8, 1986

[54] ANALOG SWITCH CIRCUIT HAVING OUTPUT OFFSET COMPENSATION CIRCUIT

[75] Inventors: Kenji Matsuo, Yokohama; Fuminari Tanaka, Kawasaki, both of Japan

[73] Assignee: Tokyo Shibaura Denki Kabushiki Kaisha, Kawasaki, Japan

[21] Appl. No.: 552,791

[22] Filed: Nov. 17, 1983

[30] Foreign Application Priority Data

Nov. 22, 1982 [JP] Japan .................. 57-205044

[51] Int. Cl.$^4$ .................. H03K 17/16; H03K 17/687
[52] U.S. Cl. .................. 307/576; 307/200 B; 307/579; 307/585
[58] Field of Search ............ 307/443, 200 B, 451–452, 307/246, 572, 576, 579, 585

[56] References Cited

U.S. PATENT DOCUMENTS

| | | | |
|---|---|---|---|
| 4,075,509 | 2/1978 | Redfern | 307/251 |
| 4,198,580 | 4/1980 | Culmer | 307/200 B X |
| 4,393,318 | 7/1983 | Takahashi et al. | 307/353 |
| 4,467,227 | 8/1984 | Lewyn et al. | 307/353 X |
| 4,473,761 | 9/1984 | Peterson | 307/585 X |
| 4,511,814 | 4/1985 | Matsuo et al. | 307/443 X |

Primary Examiner—Stanley D. Miller
Assistant Examiner—D. R. Hudspeth
Attorney, Agent, or Firm—Finnegan, Henderson, Farabow, Garrett & Dunner

[57] ABSTRACT

An analog switch circuit which is provided with a transmission gate consisting of a first n channel MOS transistor and a first p channel MOS transistor, which transistors are connected in parallel, wherein the output terminal of said transmission gate is connected to a second n channel MOS transistor and a second p channel MOS transistor, which transistors are supplied with an output voltage Vout from the transmission gate, and wherein mirror capacitances $C_{mP12}$, $C_{mP13}$, $C_{mN12}$, $C_{mN13}$ are provided at the output terminal of the transmission gate to offset a difference between the mirror capacitance $C_{mN11}$ of the first n channel MOS transistor and the mirror capacitance $C_{mP11}$ of the first p channel MOS transistor.

2 Claims, 7 Drawing Figures

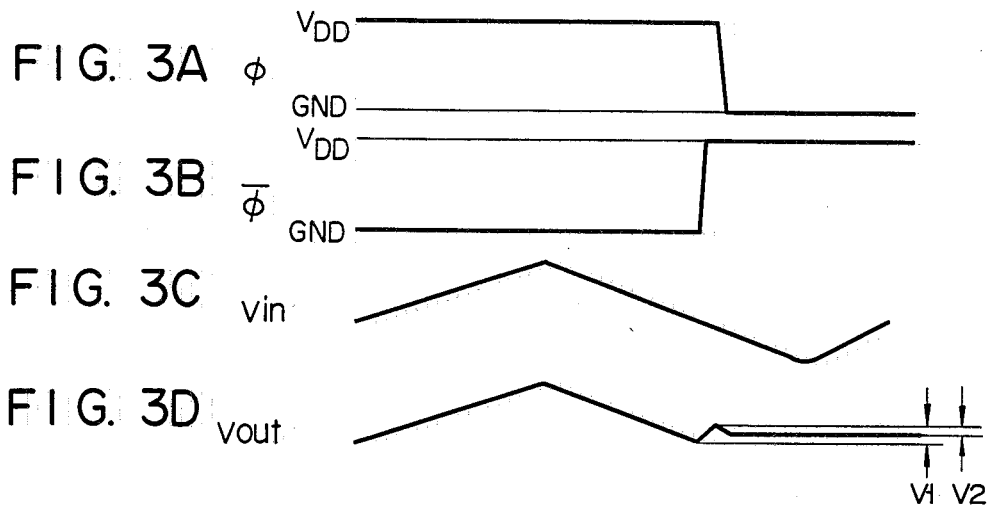
FIG. 3A φ
FIG. 3B $\overline{\phi}$
FIG. 3C Vin
FIG. 3D Vout
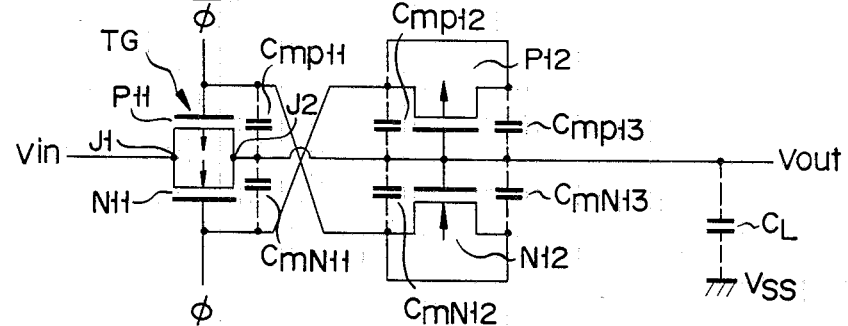
FIG. 4

ANALOG SWITCH CIRCUIT HAVING OUTPUT OFFSET COMPENSATION CIRCUIT

BACKGROUND OF THE INVENTION

This invention relates to an analog switch circuit of a CMOS (complementary metal oxide semiconductor) FET construction.

As shown in FIG. 1, an analog switch circuit of the CMOS type is fundamentally comprised of a transmission gate of the CMOS type. Specifically, the analog circuit is formed of a p channel MOS transistor $P_1$ and an n channel MOS transistor $N_1$, which transistors are connected in parallel. An input signal voltage Vin (FIG. 3C) is supplied to an input side node $J_1$ of the p and n channel MOS transistors $P_1$, $N_1$. An output signal voltage Vout (FIG. 3D) is taken out from an output side node $J_2$. The gate of the n channel MOS transistor $N_1$ is supplied with a control signal $\phi$ (FIG. 3A). The gate of the p channel MOS transistor $P_1$ is supplied with a control signal $\overline{\phi}$ (FIG. 3B) having a phase which is opposite that of signal $\phi$. A mirror capacitance $C_{mN}$ is present between the output side node $J_2$ of the n channel MOS transistor $N_1$ and the p channel MOS transistor $P_1$, and the gate of said n channel MOS transistor $N_1$. A mirror capacitance $C_{mP}$ is present between the output side node $J_2$ and the gate of the p channel MOS transistor $P_1$. A load capacitance $C_L$ is present between the output side node $J_2$ and ground. FIG. 2 is a curve diagram showing the characteristics of a resistance against the input signal voltage Vin, which resistance arises between the input and output terminals of the subject switch circuit; and the characteristics of the resistance prevailing in the p channel MOS transistor $P_1$ and n channel MOS transistor $N_1$. With reference to FIG. 2, the abscissa denotes the input signl voltage Vin, and the ordinate represents a resistance value R. Roman numerals I and II respectively indicate the curves characterizing the resistances prevailing in the p channel MOS transistor $P_1$ and the n channel MOS transistor $N_1$. Roman numeral III shows a curve characterizing a resistance prevailing throughout the subject analog switch circuit; or, specifically, the resistance between the input and output terminals thereof. In this case, it is preferred that a resistance value R prevailing between the input and output terminals of the subject analog switch circuit be rendered constant throughout the entire range of the input signal voltage Vin. To stabilize said resistance value R, the conventional practice is to let the p channel MOS transistor $P_1$ and n channel MOS transistor $N_1$ have an equal resistance value. To attain this object, the p channel MOS transistor $P_1$ is chosen in such a way as to have a channel width twice as broad as that of the n channel MOS transistor $N_1$. However, the conventional procedure has a drawback, in that capacitance $C_{mP}$ assumes a value twice that of capacitance $C_{mN}$; and, as a result, the control pulse $\phi$ has its voltage level changed from that of the $V_{DD}$ voltage to that of the ground voltage GND, and the control pulse $\overline{\phi}$ has its voltage level varied from that of the ground voltage GND to that of the $V_{DD}$ voltage. Therefore, when the transmission gate is rendered nonconductive, the output signal voltage Vout is offset from a correct value to the extent of $\Delta V$, in accordance with the difference between capacitance $C_{mP}$ and capacitance $C_{mN}$.

The offset voltage $V_1$ occurring when the control pulse $\phi$ has its logic level varied from "0" to "1", and the offset voltage $V_2$ arising when the control pulse $\overline{\phi}$ has its logic level changed from "1" to "0" are respectively expressed as follows:

$$V_1 = \frac{C_{mp}}{C_L + C_{mP} + C_{mN}} \times V_{DD}$$

$$V_2 = \frac{C_{mN}}{C_L + C_{mP} + C_{mN}} \times (-V_{DD})$$

Therefore, the output voltage Vout undesirably appears in a form offset to the extent of the sum $\Delta V$ of voltages $V_1$ and $V_2$, which sum is expressed as:

$$\Delta V = V_1 + V_2 = \left( \frac{C_{mP} - C_{mN}}{C_L + C_{mP} + C_{mN}} \right) \times V_{DD}$$

SUMMARY OF THE INVENTION

Since this invention has been contrived in view of the above, it is intended to provide an analog switch circuit which comprises a CMOS type transmission gate and is characterized in that, when the transmission gate is rendered nonconductive, it is possible to prevent the offsetting of an output voltage by a difference between the mirror capacitances of the p channel and n channel MOS transistors.

According to the invention, an analog switch circuit is provided, which circuit comprises a transmission gate consisting of a first n channel MOS transistor and a first p channel MOS transistor which are connected in parallel and whose gates are respectively supplied with control signals having opposite logic levels, and a second n channel MOS transistor and second p channel MOS transistor, whose gates are connected to the output terminal of said transmission gate.

BRIEF DESCRIPTION OF THE DRAWINGS

FIGS. 3A to 3D are time charts of signals appearing in various sections of the transmission gate of FIG. 1; and FIG. 4 is a circuit diagram of an analog switch embodying this invention.

DETAILED DESCRIPTION OF THE PREFERRED EMBODIMENT

Figure 1:
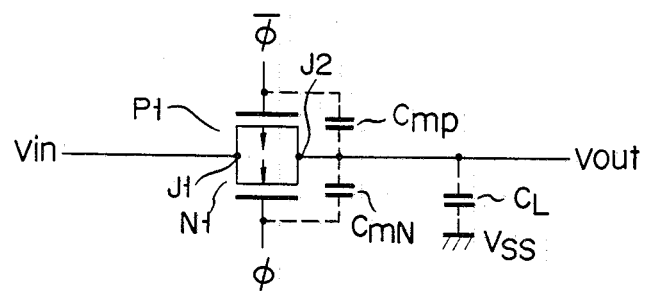
FIG. 1 is a circuit diagram of a transmission gate which basically constitutes an analog switch.
Figure 2:
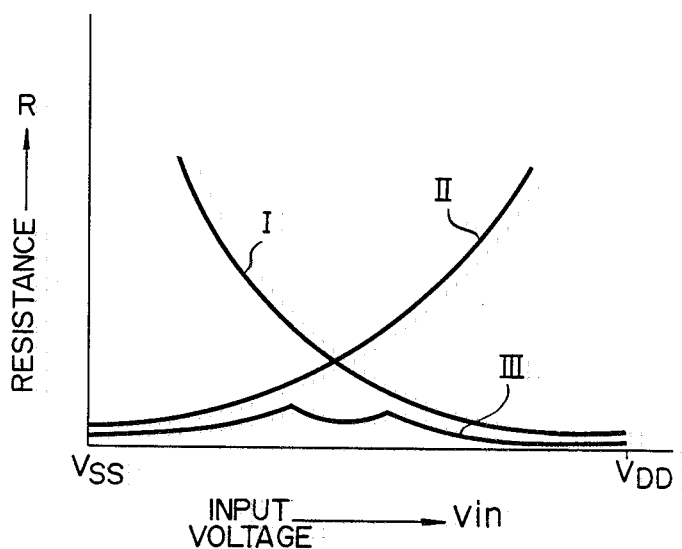
FIG. 2 is a curve diagram showing the level of a resistance presented by the transmission gate of FIG. 1 to an input signal voltage.

With reference to FIG. 4 which shows the circuit arrangement of an analog switch embodying this invention, an n channel MOS transistor $N_{11}$ and p channel MOS transistor $P_{11}$ are connected in parallel to constitute a transmission gate TG. An input signal voltage Vin is impressed on the junction $J_1$ of said transistors $N_{11}$, $P_{11}$, which junction faces the input side. An output signal voltage Vout is taken out of the other junction $J_2$ of said transistors $N_{11}$ and $P_{11}$. A control signal $\phi$ (FIG. 3A) is supplied to the gate of the n channel MOS transistor $N_{11}$. A control signal $\overline{\phi}$ (FIG. 3B) having an opposite phase to the control signal $\phi$ is delivered to the gate of the p channel MOS transistor $P_{11}$. A mirror capacitance $C_{mN11}$ is present between that junction $J_2$ of the parallel connected n channel MOS transistor $N_{11}$ and p channel MOS transistor $P_{11}$ which faces the output side of the transmission gate TG and the gate of n channel MOS transistor $N_{11}$. A similar mirror capacitance $C_{mP11}$ prevails between the junction $J_2$ facing said output side and the gate of the p channel MOS transistor $P_{11}$. The gates of an n channel MOS transistor $N_{12}$ and a p channel MOS transistor $P_{12}$ are connected to the junction $J_2$ of the aforesaid transistors $N_{11}$, $P_{11}$, which faces the output side of the transmission gate TG. Therefore, an output signal Vout from the transmission gate TG is supplied as a gate signal to the MOS transistors $N_{12}$, $P_{12}$. The source and drain of MOS transistor $N_{12}$ are connected to the gate of MOS transistor $P_{11}$. The drain and source of MOS transistor $P_{12}$ are connected to the gate of MOS transistor $N_{11}$. Therefore, the drain and source of MOS transistor $N_{12}$ are supplied with a signal $\phi$ which is delivered to the gate of the p channel MOS transistor $P_{11}$ of the transmission gate TG. The drain and source of MOS transistor $P_{12}$ are supplied with a signal $\phi$ which is delivered to the gate of the n channel MOS transistor $N_{11}$. A mirror capacitance $C_{mN12}$ is present between the gate of the n channel MOS transistor $N_{12}$ and, e.g., the drain thereof. Further, a mirror capacitance $C_{mN13}$ exists between the gate of said n channel MOS transistor $N_{12}$ and, e.g., the source thereof. A mirror capacitance $C_{mP12}$ is present between the gate of the p channel MOS transistor $P_{12}$ and, e.g., the drain thereof. A mirror capacitance $C_{mP13}$ exists between the gate of said p channel MOS transistor $P_{12}$ and, e.g., the source thereof. A load capacitance $C_L$ is present between the aforesaid junction $J_2$ facing the output side of the transmission gate TG. An output capacitance Cout, as viewed from the output side of the whole circuit of the subject analog switch, is expressed as:

$$Cout = C_L + C_{mP11} + C_{mP12} + C_{mP13} + C_{mN11} + C_{mN12} + C_{mN13}$$

Assuming that the channel widths of the respective transistors $P_{11}$, $P_{12}$, $N_{11}$, $N_{12}$ are indicated by the symbols $W_{P11}$, $W_{P12}$, $W_{N11}$ and $W_{N12}$; if, in this case, the respective channel widths are as chosen as to have relationships such as the following:

$$W_{P12} = W_{P11}/2$$

$$W_{N12} = W_{N11}/2,$$

The following equations result:

$$C_{mP12} = C_{mP13} = C_{mP11}/2$$

$$C_{mN12} = C_{mN13} = C_{mN11}/2.$$

Therefore, the forming equations are established as follows:

$$C_{mP12} + C_{mP13} = C_{mP11} \quad (1)$$

$$C_{mN12} + C_{mN13} = C_{mN11} \quad (2)$$

When the channel widths of the transistors $P_{11}$, $P_{12}$, $N_{11}$, $N_{12}$ are chosen as described above. The following facts are recognized.

(i) When the control pulse $\phi$ has its logic level changed frm "0" to "1", the resultant output voltage Vout indicates an offset voltage $V_1$ expressed as:

$$V_1 = \frac{C_{mP11}}{Cout} \times V_{DD} + \frac{C_{mN12} + C_{mN13}}{Cout} \times V_{DD} \quad (3)$$

(ii) When the control pulse $\phi$ has its logic level varied from "1" to "0", the resultant output voltage Vout shows an offset voltage $V_2$ expressed as:

$$V_2 = \frac{C_{mP12} + C_{mP13}}{Cout} \times (-V_{DD}) + \frac{C_{mN11}}{Cout} \times (-V_{DD}) \quad (4)$$

A composite offset voltage $\Delta V$ related to the output voltage Vout is represented by the sum of offset voltage $V_1$ and $V_2$, i.e., by a value arrived at by adding equations (3) and (4), and is expressed as follows:

$$\Delta V = V_1 + V_2 = \frac{V_{DD}}{Cout} [\{C_{mP11} - (C_{mP12} + C_{mP13})\} + C_{mN12} + C_{mN13} - C_{mN11}] \quad (5)$$

When the above equations (1), (2) are substituted for equation (5), the following equation results:

$$\Delta V = V_1 + V_2 = 0$$

This means that when, in the analog switch arranged as shown in FIG. 4, the channel widths of the MOS transistors $P_{11}$, $P_{12}$, $N_{11}$, $N_{12}$ are so chosen as to have such relationships as $W_{P12} = W_{P11}/2$ and $W_{N12} = W_{N11}/2$, no offset appears in the output voltage Vout when the transmission gate TG is rendered nonconductive.

The foregoing embodiment of this invention refers to the case wherein the channel width $W_{P12}$ was so chosen as to be half of channel width $W_{P11}$, and channel width $W_{N12}$ was so chosen as to be half of channel width $W_{N11}$. However, channel widths $W_{P12}$ and $W_{N12}$ need not be limited to half the corresponding channel widths ($W_{P11}$ and $W_{N11}$). If offset voltage can be overlooked to some extent, it is possible to let channel widths $W_{P12}$ and $W_{N12}$ bear any other ratio to the corresponding channel widths $W_{P11}$ and $W_{N11}$. Further, the aforementioned embodiment refers to the case wherein mirror capacitances $C_{mN12}$ and $C_{mP12}$ were respectively chosen to exit between the gates of the MOS transistors $N_{12}$, $P_{12}$, and the drains thereof. However, it is also possible to let said mirror capacitances $C_{mN12}$ and $C_{mP12}$ be present between the gates of said MOS transistors $N_{12}$, $P_{12}$ and the sources thereof. In the latter case, mirror capacitances $C_{mN13}$ and $C_{mP13}$ are obviously meant to be located between the gates of the MOS transistors $N_{12}$, $P_{12}$ and the drains thereof.

It should be noted that this invention is not limited to the above-mentioned embodiment, but can be practiced with various changes and modifications known to those skilled in the art, without departing from the scope and object of the invention.

As mentioned above, this invention provides an analog switch wherein the output side of a transmission gate consisting of a p channel MOS transistor and n channel MOS transistor is provided with a p channel MOS transistor and n channel MOS transistor which are supplied with an output voltage from said output side; and a capacitance is provided on the output side of the transmission gate, to thereby suppress the occurrence of any offset voltage resulting from a difference between the mirror capacitances of the p and n type MOS transistors constituting the transmission gate, when the transmisson gate is rendered nonconductive.

What is claimed is:

1. An analog switch circuit responsive to complementary control signals, said analog switch circuit comprising:
   a transmission gate comprising a first n channel MOS transistor and a first p channel MOS transistor which are connected in parallel to form first and second junctions, said first junction forming an input terminal and said second junction forming an output terminal, the gates of said first n and p channel MOS transistors each being connected to receive a respective one of said complementary control signals; and
   an output voltage compensation circuit comprising a second n channel MOS transistor and a second p channel MOS transistor whose gates are connected to said output terminal of said transmission gate, the drain and source of said second n channel MOS transistor being connected to said gate of said first p channel MOS transistor, and the drain and source of said second p channel MOS transistor being connected to said gate of said first n channel MOS transistor.

2. The analog switch circuit according to claim 1, wherein, when the channel widths of the first and second p channel MOS transistors are respectively denoted by $W_{P11}$, $W_{P12}$, and the channel widths of the first and second n channel MOS transistors are respectively represented by $W_{N11}$, $W_{N12}$, the following equations result:

$$W_{P12} = W_{P11}/2$$

$$W_{N12} = W_{N11}/2$$

* * * * *